(12) United States Patent
Bae et al.

(10) Patent No.: US 9,318,697 B2
(45) Date of Patent: Apr. 19, 2016

(54) METHODS OF DETECTING AN ETCH BY-PRODUCT AND METHODS OF MANUFACTURING A MAGNETORESISTIVE RANDOM ACCESS MEMORY DEVICE USING THE SAME

(71) Applicant: SAMSUNG ELECTRONICS CO., LTD., Suwon-si, Gyeonggi-do (KR)

(72) Inventors: Jin-Hye Bae, Suwon-Si (KR); Won-Jun Lee, Seoul (KR); Sung-Yoon Chung, Seoul (KR); Taek-Dong Chung, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/449,408

(22) Filed: Aug. 1, 2014

(65) Prior Publication Data

US 2015/0179927 A1 Jun. 25, 2015

(30) Foreign Application Priority Data

Dec. 24, 2013 (KR) .................. 10-2013-0162314

(51) Int. Cl.
*H01L 43/12* (2006.01)
*H01L 43/10* (2006.01)
*H01L 27/22* (2006.01)

(52) U.S. Cl.
CPC .............. *H01L 43/12* (2013.01); *H01L 27/228* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 6,590,750 B2 | 7/2003 | Abraham et al. | |
| 7,015,524 B2 | 3/2006 | Ikeda | |
| 7,291,506 B2 | 11/2007 | Nakajima et al. | |
| 7,368,397 B2 | 5/2008 | Hong | |
| 7,936,030 B2 | 5/2011 | Kim et al. | |
| 8,022,696 B2 | 9/2011 | Wittkowski | |
| 8,174,879 B2 | 5/2012 | Kang et al. | |
| 8,221,610 B2 | 7/2012 | Botte | |
| 8,252,533 B2 | 8/2012 | Park et al. | |
| 8,268,577 B2 | 9/2012 | Rishpon et al. | |
| 8,303,787 B2 | 11/2012 | Iyengar et al. | |
| 8,310,130 B2 | 11/2012 | Chiang et al. | |
| 2004/0127054 A1 | 7/2004 | Lee et al. | |
| 2004/0177867 A1* | 9/2004 | Schilling ................... 134/26 |
| 2005/0020076 A1 | 1/2005 | Lee et al. | |
| 2007/0235322 A1* | 10/2007 | Wu et al. ............... 204/192.34 |
| 2012/0315707 A1* | 12/2012 | Nam ............................ 438/3 |

FOREIGN PATENT DOCUMENTS

| | | |
|---|---|---|
| KR | 10-2012-0017317 A | 2/2012 |
| KR | 10-2012-0086938 A | 8/2012 |
| KR | 10-1202685 B1 | 11/2012 |

OTHER PUBLICATIONS

BJ Hazzard; Organicum: Practical handbook of organic chemistry; 1973; Pergamon Press, Ltd; p. 248.*

* cited by examiner

*Primary Examiner* — Pamela E Perkins
(74) *Attorney, Agent, or Firm* — Lee & Morse, P.C.

(57) ABSTRACT

In a method of detecting an etch by-product, the method including forming a magnetic layer including palladium (Pd) on a substrate; etching the magnetic layer to form a magnetic layer pattern; depositing a mixture including an alkyl bromide compound on a surface of the magnetic layer pattern; and measuring a current difference between the substrate and the mixture to detect an etch by-product on the surface of the magnetic layer pattern.

12 Claims, 18 Drawing Sheets

FIRST
DIRECTION    SECOND
   ⊗    →    DIRECTION

FIRST
DIRECTION    SECOND
   ⊗    →    DIRECTION

METHODS OF DETECTING AN ETCH BY-PRODUCT AND METHODS OF MANUFACTURING A MAGNETORESISTIVE RANDOM ACCESS MEMORY DEVICE USING THE SAME

CROSS-REFERENCE TO RELATED APPLICATION

Korean Patent Application No. 10-2013-0162314, filed on Dec. 24, 2013, in the Korean Intellectual Property Office, and entitled: "Methods of Detecting An Etch By-Product and Methods of Manufacturing A Magnetoresistive Random Access Memory Device Using the Same," is incorporated by reference herein in its entirety.

BACKGROUND

1. Field

Example embodiments relate to methods of detecting an etch by-product and methods of manufacturing a magnetoresistive random access memory (MRAM) device using the same.

2. Description of the Related Art

A MRAM device may include a magnetic tunnel junction (MTJ) structure, which may be formed by a physical etching process such as an ion sputtering.

SUMMARY

Embodiments may be realized by providing a method of detecting of etch by-product, the method including forming a magnetic layer including palladium (Pd) on a substrate; etching the magnetic layer to form a magnetic layer pattern; depositing a mixture including an alkyl bromide compound on a surface of the magnetic layer pattern; and measuring a current difference between, the substrate and the mixture to detect an etch by-product on the surface of the magnetic layer pattern.

The mixture may further include an organic solvent.

The alkyl bromide compound may include 1-bromodecane.

Measuring the current difference between the substrate and the mixture may include forming first and second electrodes to be electrically connected to each other, the first electrode contacting the substrate and second electrodes contacting the mixture; and applying a voltage to the first electrode.

Applying the voltage to the first electrode may include applying first and second voltages to the first electrode alternately and repeatedly, the second voltage being lower than the first voltage.

The second electrode may include Ag/AgCl.

The first and second electrodes may be connected to a third electrode including Ag/AgCl.

Forming the magnetic layer pattern may include forming a hardmask including a metal on the magnetic layer; and etching the magnetic layer anisotropically using the hardmask as an etching mask.

Embodiments may be realized by providing a method of manufacturing a magnetoresistive random access memory (MRAM) device, the method including forming a magnetic tunnel junction (MTJ) structure including palladium (Pd) on a substrate; depositing a mixture including an alkyl bromide compound on a surface of the MTJ structure; measuring a current difference between the substrate and the mixture to detect a conductive polymer including palladium (Pd); and cleaning the MTJ structure.

The mixture may further include an organic solvent.

The alkyl bromide compound may include 1-bromodecane.

Measuring the current difference between the substrate and the mixture may include forming first and second electrodes to be electrically connected to each other, the first electrode contacting the substrate and second electrodes contacting the mixture; and applying a voltage to the first electrode.

Forming the MTJ structure may include sequentially forming a lower electrode layer, a fixed layer structure, a tunnel barrier layer, a tree layer and an upper electrode on the substrate; and patterning the tree layer, the tunnel barrier layer, the fixed layer structure and the lower electrode layer sequentially using the upper electrode as an etching mask to form the MTJ structure and a lower electrode thereunder, the MTJ structure including a fixed layer structure pattern, a tunnel barrier layer pattern and a free layer pattern sequentially stacked.

The fixed layer structure or the free layer may include palladium (Pd).

Cleaning the MTJ structure may include removing the conductive polymer using a cleaning composition.

Embodiments may be realized by providing a method of manufacturing a magnetoresistive random access memory device, the method including forming a magnetic layer pattern on a substrate; depositing a mixture including an alkyl bromide compound on the magnetic layer pattern; and measuring a current difference between the substrate and the mixture. The magnetic layer pattern is not damaged by the depositing or measuring steps.

The measuring step may indicate presence of a conductive polymer; and the depositing step may initiate a chemical reaction between the alkyl bromide compound and palladium in the conductive polymer.

The method may further include reducing the alkyl bromide compound by the chemical reaction.

The method may further include removing the mixture.

The method may further include generating the conductive polymer during the forming step.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
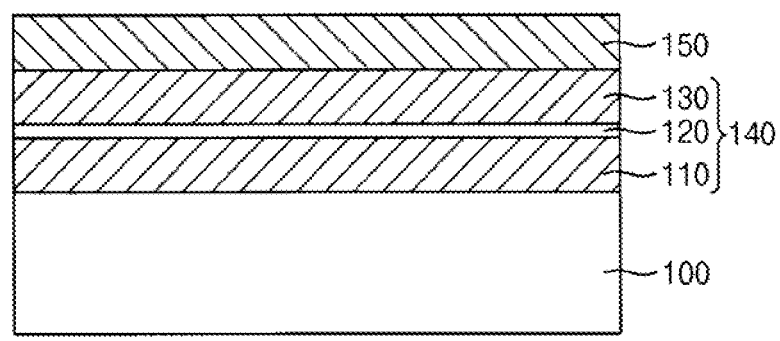
FIGS. 1 to 4 illustrate cross-sectional views of stages in a method of detecting an etch by-product in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the sizes and relative sizes of layers and regions may be exaggerated for clarity. Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different, directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Spatially relative terms, such as "beneath," "below," "lower," "above," "upper" and the like, may be used herein for ease of description to describe one element or feature's relationship to another element(s) or feature(s) as illustrated in die figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise, it will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of skill in the art. It will be further understood that terms, such as those defined in commonly used dictionaries, should be interpreted as having a meaning that, is consistent with their meaning in the context, of the relevant art and will not be interpreted in an idealized or overly formal sense unless expressly so defined herein.

FIGS. 1 to 4 are cross-sectional views illustrating stages in a method of detecting an etch by-product in accordance with example embodiments.

Referring to FIG. 1, a lower magnetic layer 310, a barrier layer 120, an upper magnetic layer 130 and a hardmask layer 150 may be sequentially formed on a substrate 100.

The lower magnetic layer 110 may be formed to include a ferromagnetic material, e.g., palladium (Pd). The lower magnetic layer 110 may have a first magnetization direction fixed in one direction. In example embodiments, the first magnetization direction may be substantially perpendicular to a top surface of the substrate 100 or substantially parallel to the top surface of the substrate 100.

The upper magnetic layer 130 may be formed to include a ferromagnetic material, e.g., palladium (Pd). The upper magnetic layer 130 may have a second magnetization direction which may not be fixed in one direction but may be reversible. In example embodiments, the second magnetization direction may be substantially perpendicular or parallel to the top surface of the substrate 100. In one embodiment, the second magnetization direction may be substantially the same as the first magnetization direction.

The barrier layer 120 may be formed to include a metal oxide, a metal nitride or a metal oxynitride, e.g., magnesium oxide (MgO) or aluminum oxide ($AlO_x$).

The hardmask layer 150 may be formed to include a metal or a metal nitride, e.g., titanium (Ti), titanium nitride (TiN), tantalum (Ta), tantalum nitride (TaN), tungsten (W) or tungsten nitride (WN).

The lower and upper magnetic layers 110 and 130 together with the barrier layer 120 may be defined as a magnetic layer structure 140.

Figure 2:
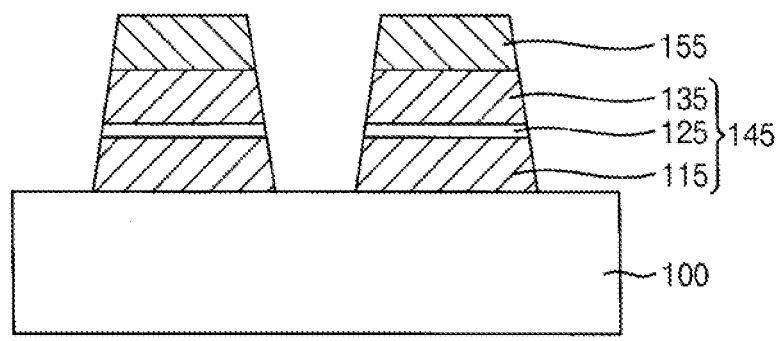

Referring to FIG. 2, the hardmask layer 150 may be etched to form a hardmask 155, and the magnetic layer structure 140 may be anisotropically etched using the hardmask 155 as an etching mask. The lower and upper magnetic layers 110 and 130 and the barrier layer 120 may be partially removed to form, a magnetic layer pattern structure 145 including a lower magnetic layer pattern 115, a barrier layer pattern 125 and an upper magnetic layer pattern 135 sequentially stacked on the substrate 100.

The etching process may be performed by a physical etching process such, as a plasma reaction etching process or an ion sputtering process. The plasma reaction etching process may be performed using an etching gas including, e.g., HF and/or $NH_3$, and a reaction gas including, e.g., oxygen.

A conductive polymer may be generated as an etch by-product in the etching process. The conductive polymer may include the ferromagnetic material included in the lower magnetic layer 110 and/or the upper magnetic layer 130, and may be re-sputtered during the etching process, and may be attached onto a sidewall of the magnetic layer pattern structure 145.

Figure 3:
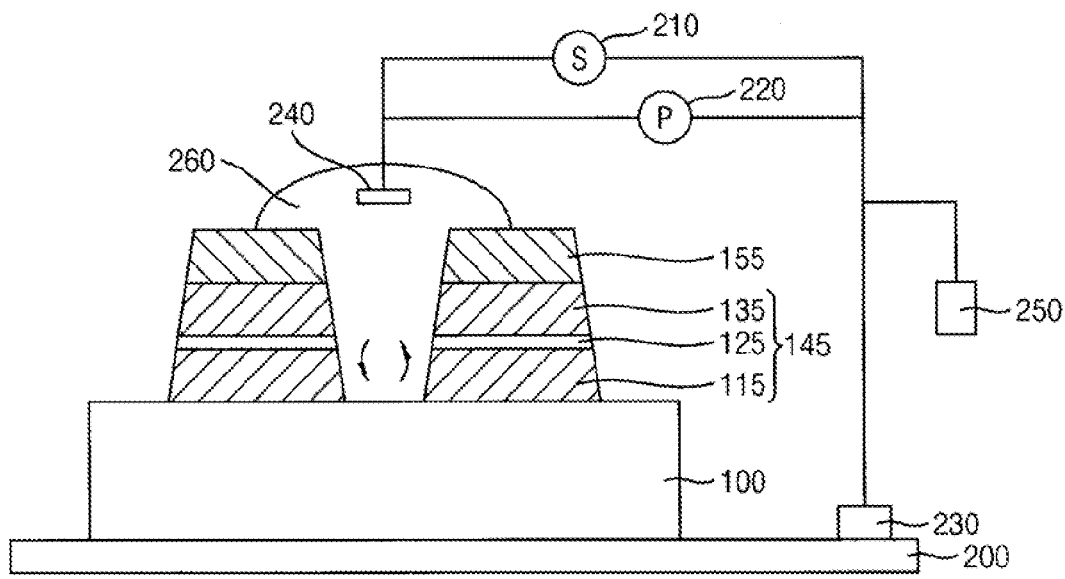

Referring to FIG. 3, the substrate 100 on which the magnetic layer pattern structure 145 is formed may be loaded on a stage 200 of a detecting machine (not shown), and a mixture 260 including an alkyl bromide compound may be provided on the substrate 100 to contact a surface of the magnetic layer pattern structure 145. For example, as illustrated in FIG. 3, the mixture 260 may cover upper and inner surfaces of the magnetic layer pattern structure 145.

The mixture 260 may be formed by dissolving the alkyl bromide compound in a solvent. The solvent may be an organic solvent, e.g., dimethylformamide (DMF). In example embodiments, the alkyl bromide compound may include 1-bromodecane.

The conductive polymer remaining on the sidewall of the magnetic layer pattern 145 may include palladium (Pd), and the conductive polymer may be reacted with the mixture 260. A chemical reaction may occur between the alkyl bromide compound in the mixture 260 and palladium in the conductive polymer, and the alkyl bromide compound may be reduced.

Thereafter, a current difference between the substrate 100 and the mixture 260 may be measured by a cyclic voltammetry.

First and second electrodes 230 and 240 contacting the stage 200 on which the substrate 100 is loaded and the mixture 260, respectively, may be formed to be electrically connected to each other, and a third electrode 250 may be formed to be electrically connected to the first and second electrodes 230 and 240. The first and second electrodes 230 and 240 may serve as a working electrode and a counter electrode with respect thereto, respectively, to generate an electrode reaction, and the third electrode 250 may serve as a reference electrode for measuring an electrode potential of the electrode reaction. In example embodiments, the first and second electrodes 230 and 240 may include titanium nitride (TiN) and lead (Pb), respectively, and the third electrode 250 may include Ag/AgCl.

Figure 4:
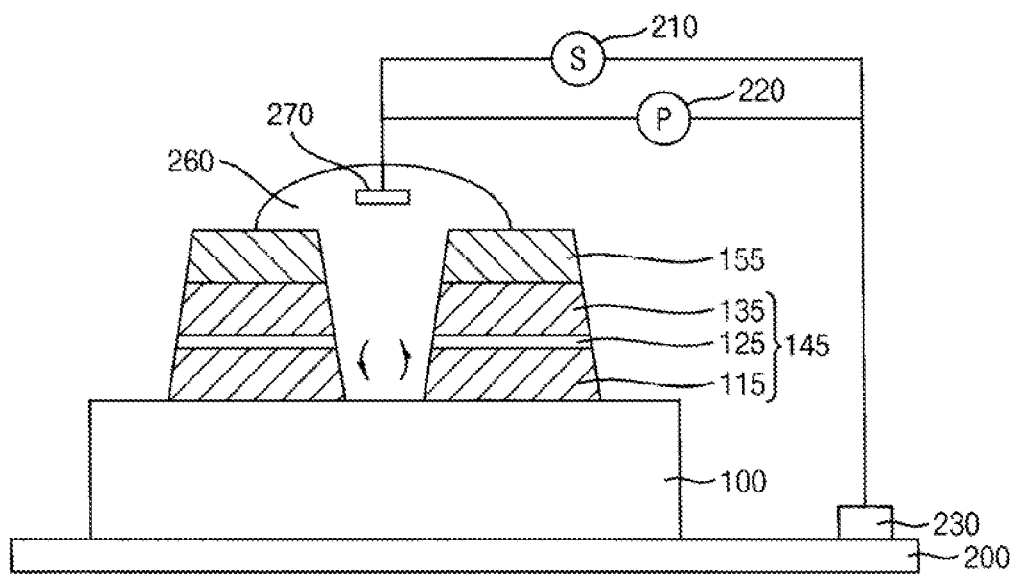

Alternatively, as shown in FIG. 4, the first electrode 230 contacting the stage 200 and a fourth electrode 270 contacting the mixture 260 may be formed to be electrically connected to each other. The first and fourth electrodes 230 and 270 may serve as a working electrode and a reference electrode, respectively. In example embodiments, the first and fourth electrodes 230 and 270 may include titanium nitride (TiN) and Ag/AgCl, respectively.

A first voltage and a second voltage lower than the first voltage may be alternately and repeatedly applied to the first electrode 230 using a power supply 210, and a current difference may be measured using a potentiometer 220. If a conductive polymer including palladium (Pd) is generated during the etching process and is deposited on the surfaces of the magnetic layer pattern structure 145, a rapid current difference may be measured by the potentiometer 220 due to the chemical reaction, i.e., due to reduction of the bromide compound in the mixture 260, according to the first and second voltages applied to the first electrode 230.

An etch by-product including palladium (Pd) generated during the etching process may be quickly and easily detected with no damage to the magnetic layer pattern structure 145.

FIGS. 5 to 27 are cross-sectional views illustrating stages of a method of manufacturing a MRAM device in accordance with example embodiments.

Figure 5:
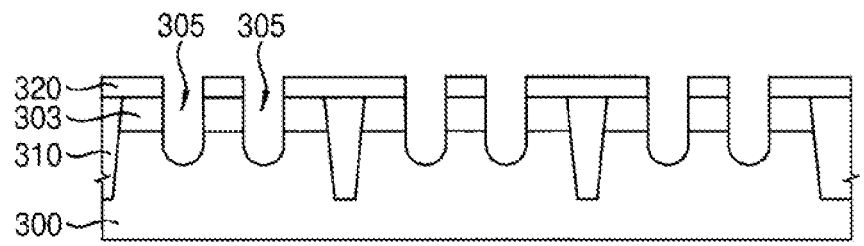
FIGS. 5 to 27 illustrate cross-sectional views of stages in a method of manufacturing a MRAM device in accordance with example embodiments.

Referring to FIG. 5, impurities may be implanted into an upper portion of a substrate 300 to form an impurity region 303, and an isolation layer pattern 310 may be formed on the substrate 300. A portion of the substrate 300 on which the isolation layer pattern 310 is formed may be defined as a field region, a portion of the substrate 300 on which no isolation layer pattern is formed may be defined as an active region, and the substrate 300 may be divided into the active region and the field region.

The substrate 300 may be, e.g., a silicon substrate, a germanium substrate, a silicon-germanium substrate, a silicon-on-insulator (SOI) substrate, or a germanium-on-insulator (GOI) substrate.

The impurity region 303 may be formed by performing an ion implantation process on the substrate 300, and may include, e.g., n-type impurities such as phosphorus or arsenic, or p-type impurities such as boron or gallium. The impurity region 303 together with a gate structure 360 subsequently formed (refer to FIG. 8) may be defined as a transistor, and the impurity region 303 may serve as source/drain regions of the transistor.

The isolation layer pattern 310 may be formed by forming a first trench (not shown) at an upper portion of the substrate 300, forming an isolation layer on the substrate 300 to sufficiently fill the first trench, and plagiarizing an upper portion of the isolation layer until a top surface of the substrate 300 may be exposed. The isolation layer may be formed to include an oxide, for example, silicon oxide.

In some embodiments, the impurity region 303 may be formed after the isolation layer pattern 310 is formed.

A first mask 320 may be formed on the substrate 300 to expose a portion of the substrate 300, and the exposed portion of the substrate 300 may be removed using the first mask 320 as an etching mask to form a second trench 305.

A plurality of second trenches 305 may be formed in a second direction substantially parallel to the top surface of the substrate 300, each of which may extend in a first direction substantially parallel to the top surface of the substrate 300 and substantially perpendicular to the second direction. In example embodiments, two second trenches 305 may be formed within each active region divided by the isolation layer pattern 310.

Figure 6:
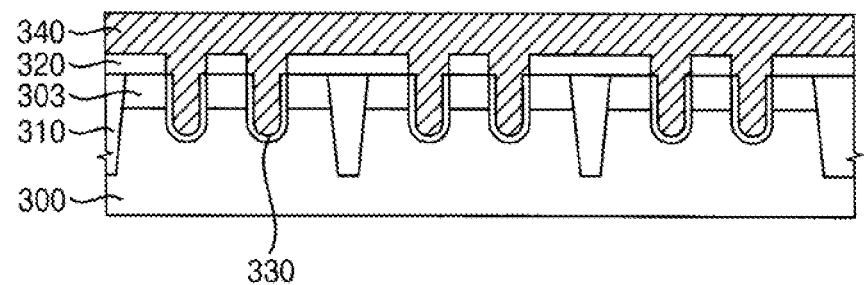

Referring to FIG. 6, a gate insulation layer 330 may be formed on an inner wall of the second trench 305, and a gate electrode layer 340 may be formed on the gate insulation layer 330 and the first mask 320 to sufficiently fill the second trench 305.

In example embodiments, the gate insulation layer 330 may be formed by performing a thermal oxidation process or a chemical vapor deposition (CVD) process on an upper portion of the substrate 300 exposed through the second trench 305. The gate insulation layer 330 may be formed to include an oxide, e.g., silicon oxide.

The gate electrode layer 340 may be formed to include a metal, e.g., tungsten (W), titanium (Ti), tantalum (Ta), or a combination thereof, a metal nitride, e.g., tungsten nitride (WN), titanium nitride (TiN), tantalum nitride (TaN), or a combination thereof, and/or a metal silicide.

Figure 7:
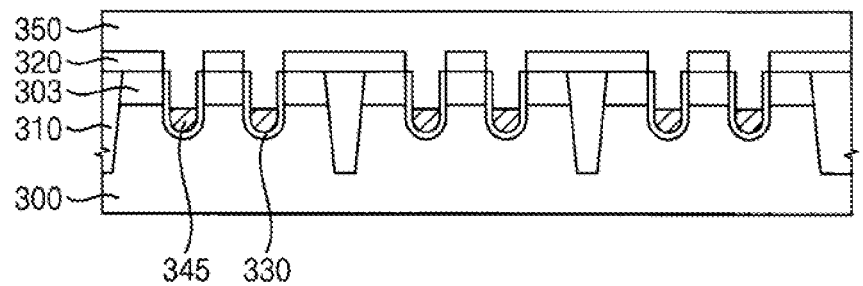

Referring to FIG. 7, an upper portion of the gate electrode layer 340 may be removed to form a gate electrode 345 partially filling the second trench 305, and a first capping layer 350 may be formed on the gate electrode 345, the gate insulation layer 330 and the first mask 320 to fill a remaining portion of the second trench 305.

In example embodiments, the gate electrode layer 340 may be removed by a chemical mechanical polishing (CMP) process and/or an etch back process. The gate electrode 345 may be formed in a lower portion of the second trench 305 to extend in the first direction, and a plurality of gate electrodes 345 may be formed, e.g., spaced apart from each other, in the second direction. When the gate electrode 345 is formed, a portion of the gate insulation layer 330 may be removed. The gate insulation layer 330 may be formed on a lower inner wall of the second trench 305 to surround a sidewall and a bottom surface of the gate electrode 345.

The first capping layer 350 may be formed to include a nitride, e.g., silicon nitride.

Figure 8:
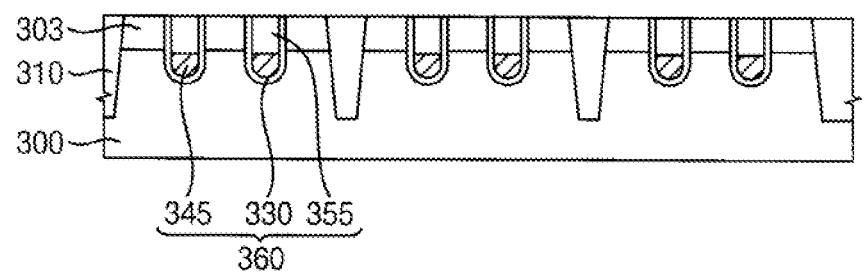

Referring to FIG. 8, an upper portion of the first capping layer 350 and the first mask 320 may be removed by, e.g., a CMP process until the top surface of the substrate 300 may be exposed. A first capping layer pattern 355 may be formed to fill an upper portion of the second trench 305. A plurality of first capping layer patterns 355 may be formed in the second direction, each of which may extend in the first direction.

The gate insulation layer 330, the gate electrode 345 and the first capping layer pattern 355 may form a gate structure 360. The gate structure 360 may be a buried gate structure filling the second trench 305. A plurality of gate structures 360 may be formed in the second direction, each of which may extend in the first direction. In example embodiments, two gate structures 360 may be formed within each active region.

Figure 9:
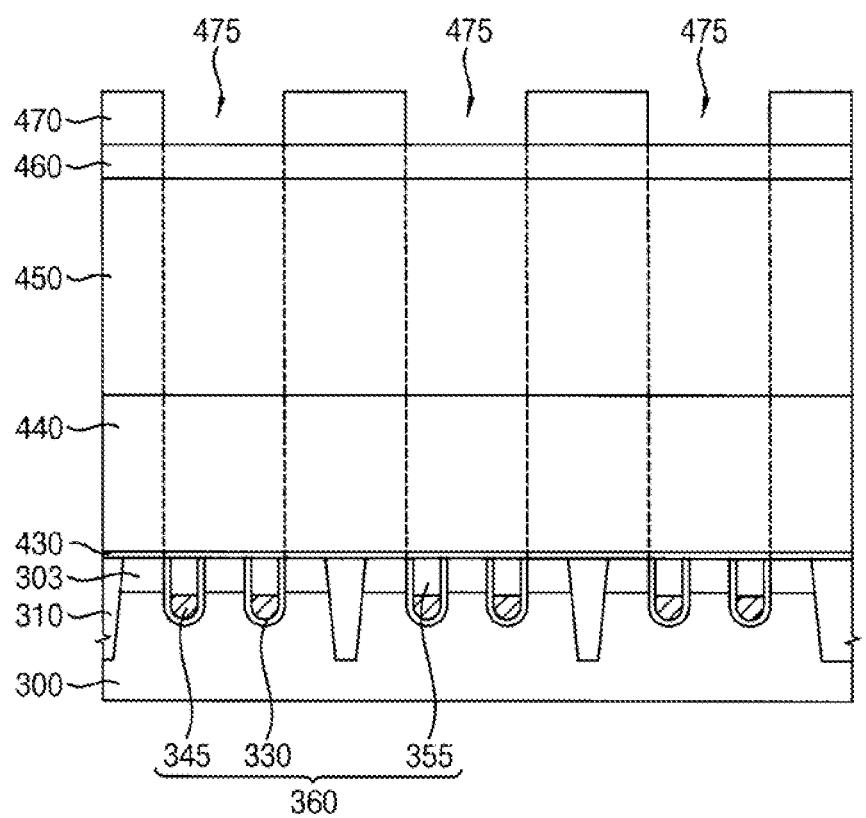

Referring to FIG. 9, an etch stop layer 430, a first insulating interlayer 440, a silicon-on-hardmask (SOH) layer 450, a silicon oxynitride layer 460 and a first photoresist pattern 470 may be sequentially formed on the substrate 300.

The etch stop layer 430 may be formed to include a nitride, e.g., silicon nitride, and the first insulating interlayer 440 may be formed to include an oxide, e.g., boro phospho silicate glass (BPSG), undoped silicate glass (USG) and spin on glass (SOG), A portion of the first insulating interlayer 440 may be removed in subsequent processes, and may serve as a sacrificial layer.

The first photoresist pattern 470 may include first openings 475 exposing portions of a top surface of the silicon oxynitride layer 460. Each first opening 475 may extend in the first direction, and a plurality of first openings 475 may be formed in the second direction. In example embodiments, each first opening 475 may overlap two of the gate structures 360 adjacent to each other in each active region and a portion of the substrate 300 therebetween.

Figure 10:
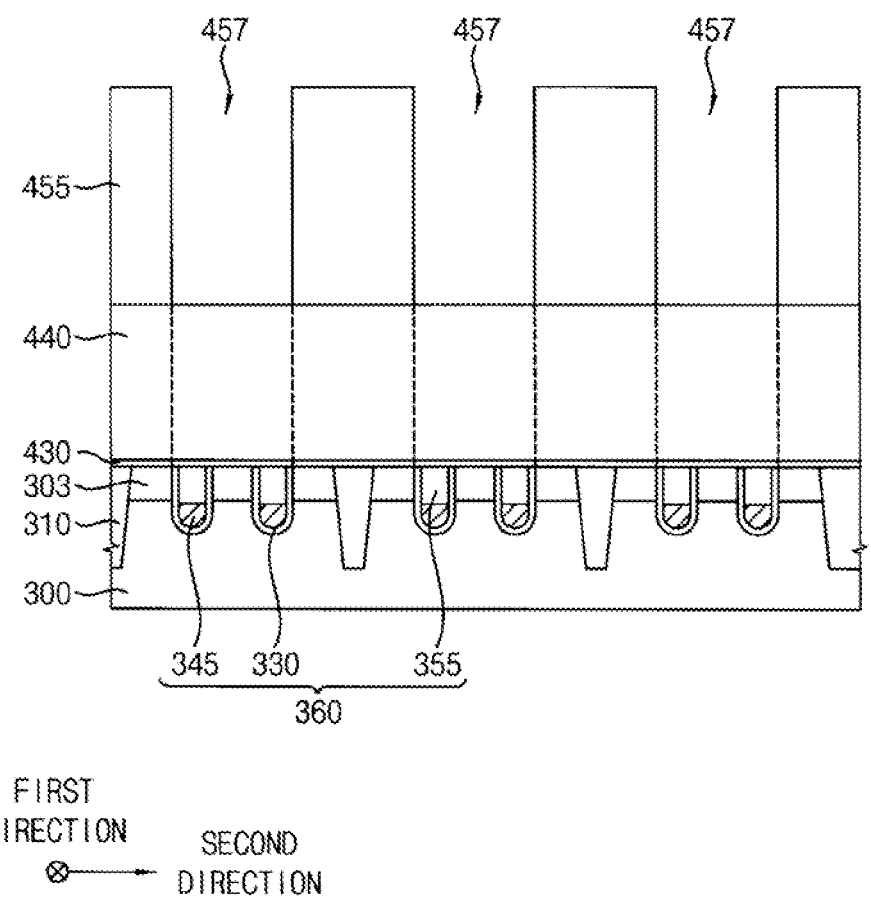

Referring to FIG. 10, the silicon oxynitride layer 460 and the SOH layer 450 may be sequentially etched using the first photoresist pattern 470 as an etching mask. A silicon oxynitride layer pattern and a SOH layer pattern 455 may be formed, and the SOH layer pattern 455 may include second, openings 457 exposing portions of a top surface of the first insulating interlayer 440. The silicon oxynitride layer pattern may be removed by, e.g., a wet etching process after the SOH layer pattern 455 is formed.

Figure 11:
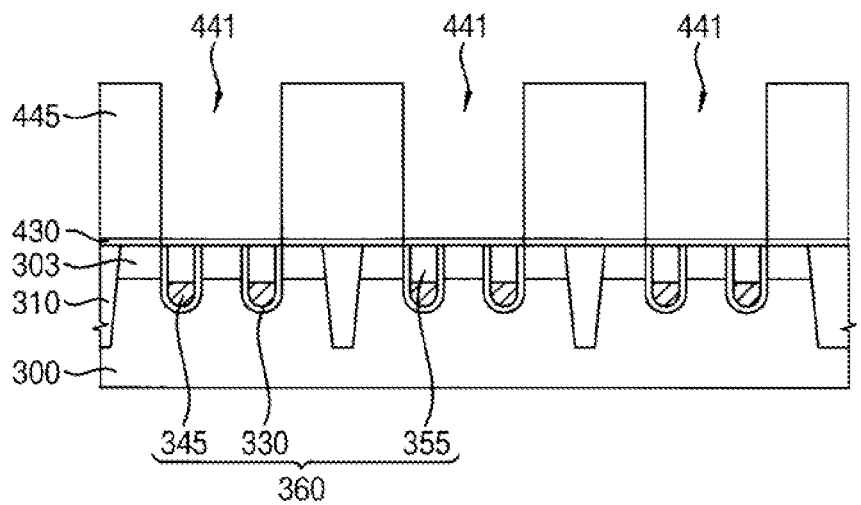

Referring to FIG. 11, the first insulating interlayer 440 may be etched using the SOH layer pattern 455 as an etching mask. The exposed portions of the first insulating interlayer 440 may be removed to form a first insulating interlayer pattern 445 having third openings 441, and portions of a top surface of the etch stop layer 430 may be exposed.

Figure 12:
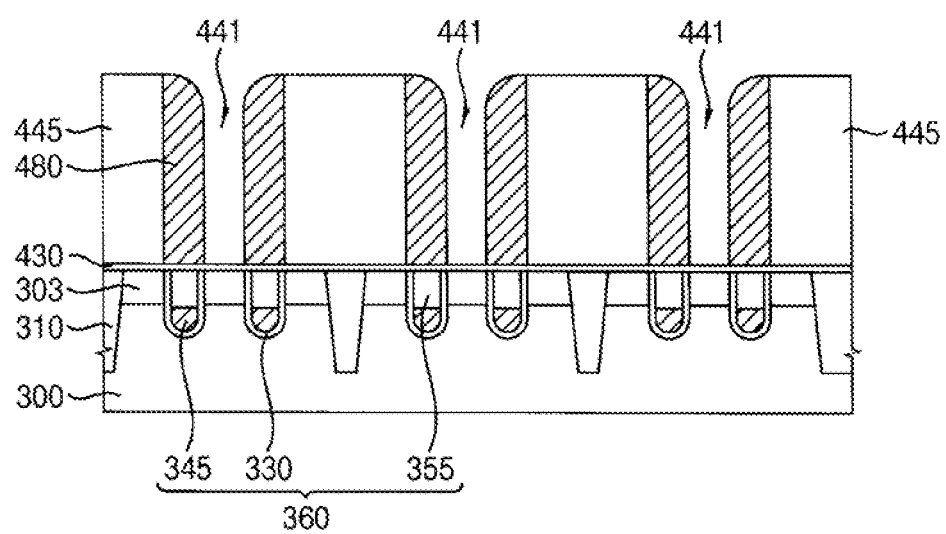

Referring to FIG. 12, a first spacer 480 may be formed on a sidewall of each third opening 441.

The first spacer 480 may be formed by forming a first spacer layer on the sidewalls of the third openings 441, the exposed portions of the etch stop layer 430 and a top surface of the first insulating interlayer pattern 445, and anisotropically etching the first spacer layer. Two first spacers 480 may be formed on each active region, and each first spacer 480 may be formed to overlap the gate structure 360. Each third opening 441 may extend in the first direction, and a plurality of third openings 441 may be formed in the second direction. Each first spacer 480 may extend in the first direction, and a plurality of first spacers 480 may be formed in the second direction. The first spacer layer may be formed to include a nitride, e.g., silicon nitride.

Figure 13:
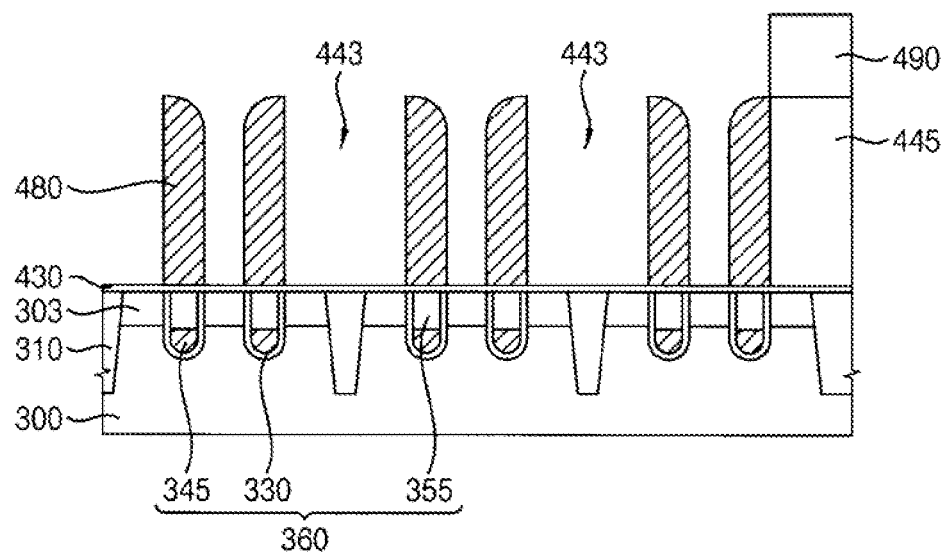

Referring to FIG. 13, a second mask 490 may be formed on a portion of the first insulating interlayer pattern 445, and exposed portions of the first insulating interlayer pattern 445 not covered by the second mask 490 may be removed, to form fourth openings 443 exposing portions of a top surface of the etch stop layer 430.

The exposed portions of the first insulating interlayer pattern 445 may be removed by, e.g., a wet etching process.

The first spacers 480 may remain on the substrate 300, and may be spaced apart from each other in the second direction.

Figure 14:
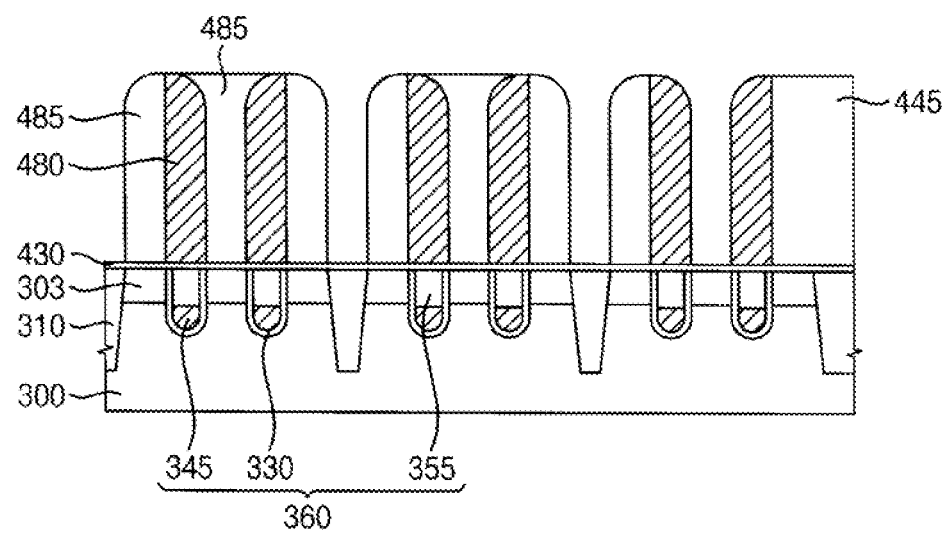

Referring to FIG. 14, the second mask 490 may be removed, and second spacers 485 contacting the first spacers 480 may be formed on the substrate 300.

In example embodiments, the second spacers 485 may be formed by forming a second spacer layer on the etch stop layer 430 and the first insulating interlayer pattern 445 to cover the first spacers 480, and anisotropically etching the second spacer layer. The second spacer layer may include an oxide, e.g., silicon oxide, and a portion of the second spacer layer contacting the first insulating interlayer pattern 445 may be merged thereto.

In example embodiments, the second spacers 485 may sufficiently fill spaces between two of the first spacers 480 which are spaced apart from each other in the second direction on each active region, and may partially fill spaces between two of the first spacers 480 adjacent to each other which define the fourth opening 443. Portions of the exposed top surface of the etch stop layer 430 by the fourth openings 443 may not be completely covered by the second spacers 485.

Figure 15:
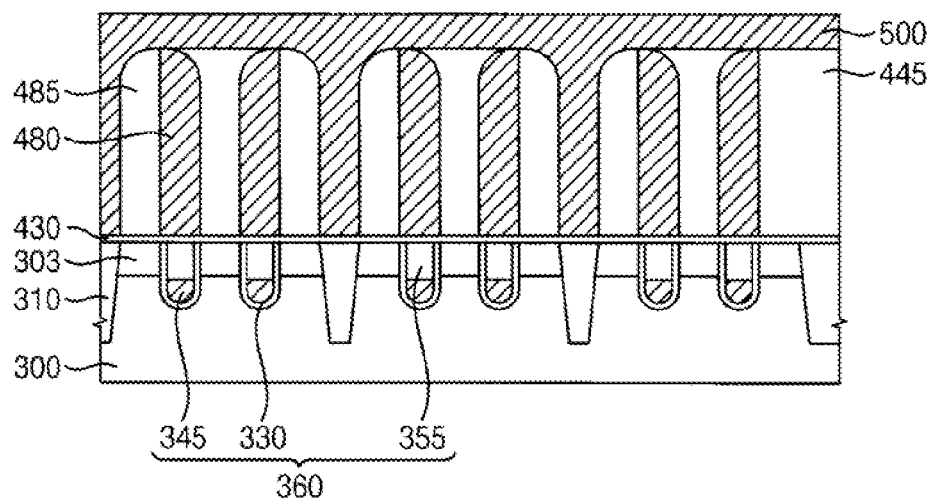

Referring to FIG. 15, a filling layer 500 may be formed on the etch stop layer 430, the first spacers 480, the second spacers 485 and the first insulating interlayer pattern 445 to fill remaining portions of the fourth, openings 443.

In example embodiments, the filling layer 500 may be formed to include a material substantially the same as that of the second spacers 480, i.e., a nitride such as silicon nitride.

Figure 16:
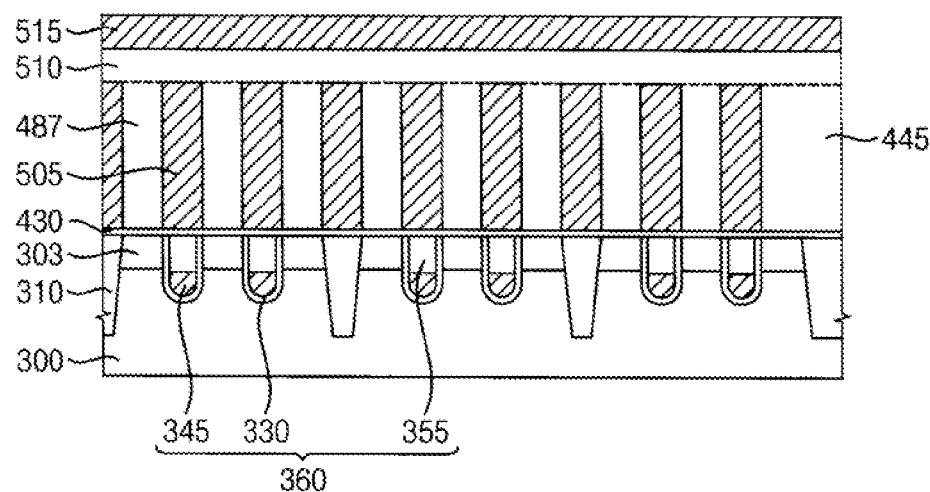

Referring to FIG. 16, an upper portion of the fining layer 500, upper portions of the first and second spacers 480 and 485 and an upper portion of the first insulating interlayer pattern 445 may be planarized to form first and second patterns 505 and 487, and second and third capping layers 510 and 515 may be sequentially formed.

In example embodiments, the planarization process may be performed by a CMP process and/or an etch back process.

According to the planarization process, the first spacers 480 and the filling layer 500 may be converted into the first patterns 505, and the second spacers 485 may be converted into the second patterns 487. Each of the first and second patterns 505 and 487 may extend in the first direction, and the first and second patterns 505 and 48 may be alternately and repeatedly formed in the second direction. The first and second patterns 505 and 487 may contact each other. In example embodiments, at least some of the first patterns 505 may overlap the gate structure 360, and the others of the first patterns 505 may overlap the isolation layer pattern 310. In example embodiments, the second patterns 487 may overlap the impurity region 303 adjacent to the gate structure 360.

The second capping layer 510 may be formed to include an oxide, e.g., silicon oxide. The second capping layer 510 may cover top surfaces of the first and second patterns 505 and 487 and a top surface of the first insulating interlayer pattern 445, and may be merged to the second patterns 487 and the first insulating interlayer pattern 445.

The third capping layer 515 may be formed to include a nitride, e.g., silicon nitride.

Figure 17:
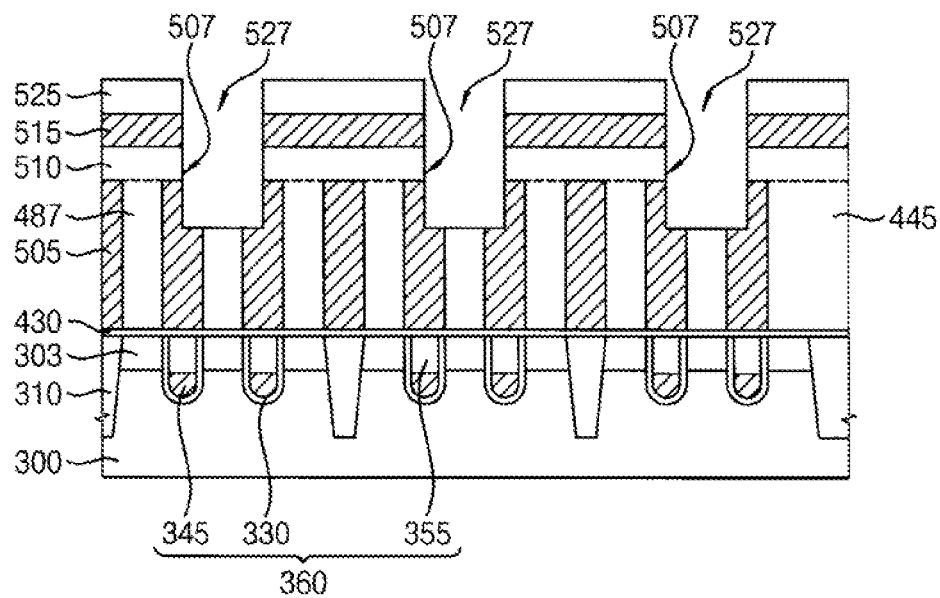

Referring to FIG. 17, a second photoresist pattern 525 may be formed on the third capping layer 515, and the second and third capping layers 510 and 515 and upper portions of the first and second patterns 505 and 487 thereunder may be etched using the second photoresist pattern 525 as an etching mask to form recesses 507.

In example embodiments, the second photoresist pattern 525 may include fifth openings 527 exposing portions of a top surface of the third capping layer 515. Each fifth opening 527 may extend in the first direction, and a plurality of fifth openings 527 may be formed in the second direction. Each fifth opening 527 may overlap the second pattern 487 on a portion of the substrate 300 between the gate structures 360 adjacent to each other in each active region and a portion of the first patterns 505 adjacent thereto. The second patterns 487 on the substrate 300 between the gate structures 360 adjacent to each other in each active region may be exposed by the recesses 507.

Figure 18:
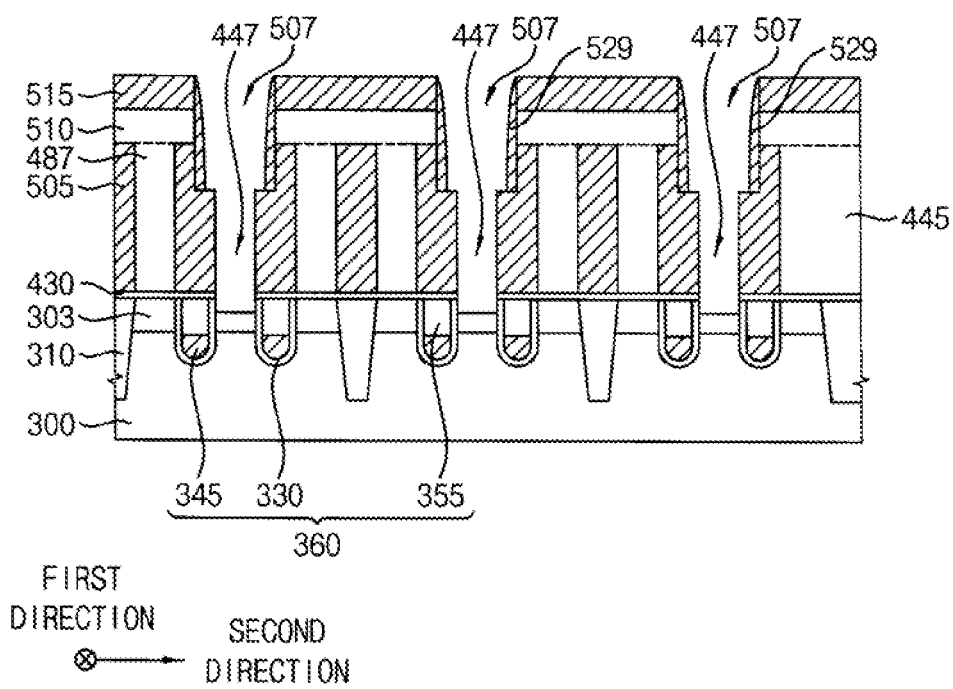

Referring to FIG. 18, the second photoresist pattern 525 may be removed, and an etch stop layer pattern 529 may be formed on sidewalls of the second and third capping layers 510 and 515 and upper sidewalls of the first patterns 505 exposed by each recess 507.

The etch stop layer pattern; 529 may be formed by forming an etch stop layer on inner walls of the recesses 507 and the top surface of the third capping layer 515, and etching the etch stop layer anisotropically. The etch stop layer pattern 529 may cover sidewalls of the second and third capping layers 510 and 515.

The etch stop layer pattern 529 may be formed to include a material substantially the same as that of the first patterns 505 and/or the third capping layer 515, i.e., a nitride such as silicon nitride to be merged thereto, and may have a high etching selectivity with respect to the second patterns 487 and/or the second capping layer 510. The second capping layer 510 may be prevented from being etched by the etch stop layer pattern 529 when a wet etching process for the second patterns 487 is subsequently performed.

The second patterns 487 exposed by the recesses 507 may be removed, and portions of the etch stop layer 430 thereunder may be removed to form sixth openings 447 exposing upper portions of the substrate 300 and being in fluid communication with the recesses 507, respectively. The exposed second patterns 487 may be removed by, e.g., a wet etching process, and the portions of the etch, stop layer 430 thereunder may be removed by, e.g., a dry etching process.

Each sixth opening 447 may be formed to extend in the first direction. The recess 507 and the sixth opening 447 in fluid communication therewith may be referred to simply as a seventh opening for the convenience of explanation.

Figure 19:
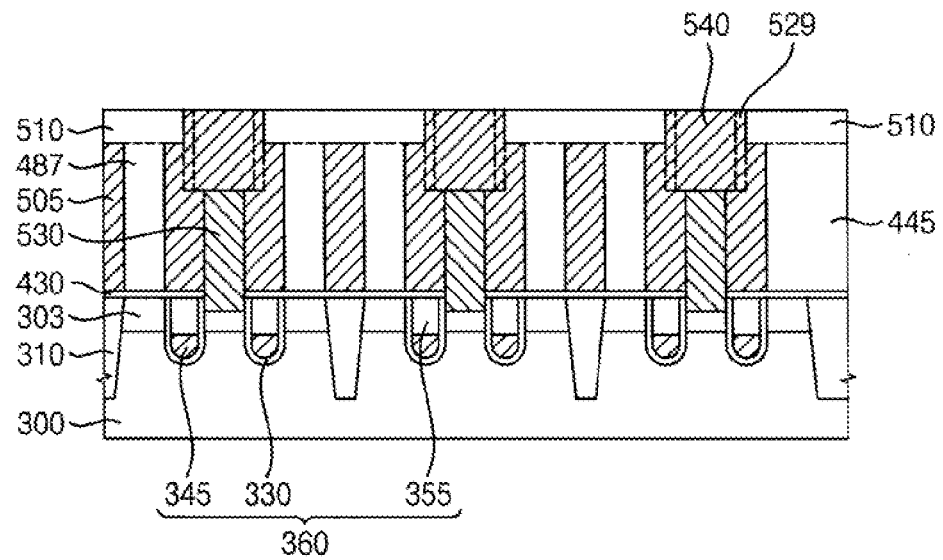

Referring to FIG. 19, a source line 530 may be formed to fill each sixth opening 447, and a fourth capping layer pattern 540 may be formed on the source line 530 to fill each recess 507.

The source line 530 may be formed by forming a first conductive layer on the exposed upper portions of the substrate 300 to fill the sixth, openings 447 and the recesses 507, and removing an upper portion of the first conductive layer. In example embodiments, portions of the first conductive layer in the recesses 507 may be removed. Each source line 530 may extend in the first direction, and a plurality of source lines 530 may be formed in the second direction to fill lower portions of each seventh opening. The first conductive layer may be formed to include a metal, e.g., tungsten (W), titanium (Ti), or tantalum (Ta), and a metal nitride, e.g., tungsten nitride (WN), titanium nitride (TiN), or tantalum nitride (TaN).

The fourth capping layer pattern 540 may be formed by forming a fourth capping layer on the source lines 530, the etch stop layer patterns 529 and the third capping layer 515 to fill the recesses 507, and planarizing an upper portion of the fourth capping layer and the third capping layer 515 until a top surface of the second capping layer 510 may be exposed. The third capping layer 515 may be completely removed, and the fourth capping layer pattern 540 may fill the upper portions of the seventh openings. The fourth capping layer may be formed to include a nitride, e.g., silicon nitride, and the fourth capping layer pattern 540 may be merged to the first patterns 505 and/or the etch stop layer patterns 529.

Thereafter, a third mask (not shown) may be formed on the substrate 300, and the second capping layer 510 and the second patterns 487 may be etched using the third mask as an etching mask. In example embodiments, the etching process may be performed by, e.g., a dry etching process. During the dry etching process, portions of the etch stop layer 430 and the substrate 300 under the second patterns 487 may be also removed to form eighth openings (not shown) exposing upper portions of the substrate 300.

An first insulating layer (not shown) may be formed on the substrate 300, the first patterns 505, the fourth capping layer patterns 540 and the third mask to sufficiently fill the eighth openings, and an upper portion of the first insulating layer may be planarized until an upper portion of the third mask may be removed to form third patterns (not shown). The first insulating layer may include a nitride, e.g., silicon nitride, and may be merged to the first patterns 505, the fourth capping layer patterns 540, the etch stop layer patterns 529 and the second capping layer 510. In example embodiments, each third pattern may be formed to extend in the second direction, and a plurality of third patterns may be formed in the first direction.

Figure 20:
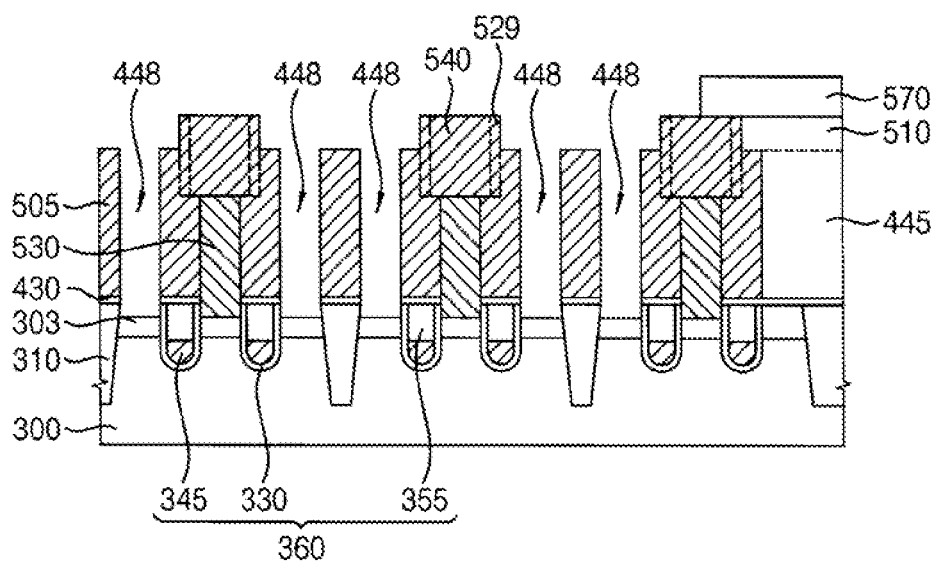

Referring to FIG. 20, a third photoresist pattern 570 may be formed on the second capping layer 510, portions of the fourth capping layer patterns 540 and the etch stop layer pattern 529 and the third patterns, and the second capping layer 510 and the second patterns 487 thereunder may be etched using the third photoresist pattern 570 as an etching mask.

In example embodiments, the second capping layer 510 and the second patterns 487 may include a material having an etching selectivity with respect to the first patterns 505, the third patterns, the fourth capping layer patterns 540 and the etch stop layer patterns 529, e.g., an oxide such as silicon oxide, and may be removed by performing a wet etching process.

Thereafter, portions of the etch stop layer 430 exposed by the etching process may be removed by a dry etching process to form ninth openings 448 exposing portions of the top surface of the substrate 300.

Figure 21:
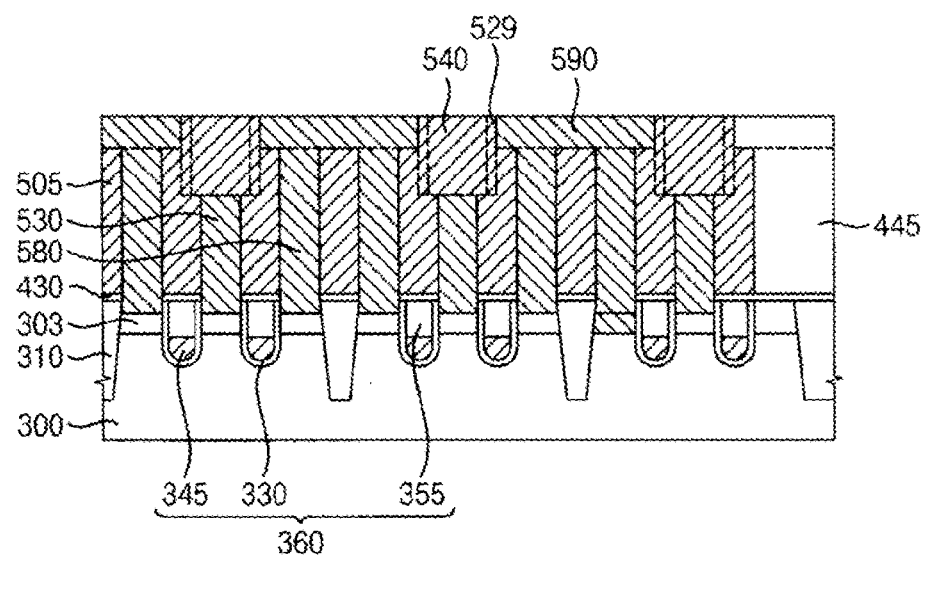

Referring to FIG. 21, the third photoresist pattern 570 may be removed by, e.g., a wet etching process, and a contact plug 580 and a pad layer 590 may be formed to fill each ninth opening 448.

The contact plug 580 and the pad layer 590 may be formed by forming a second conductive layer on the substrate 300, the first patterns 505, the third patterns, the fourth capping layer pattern 540, the etch stop layer pattern 529 to fill the ninth openings 448, and planarizing an upper portion of the second conductive layer until the top surface of the fourth capping layer pattern 540 may be exposed. Upper portions of the planarized second conductive layer may serve as pad layer 590, and lower portions thereof may serve as the contact plug 580. The contact plug 580 and the pad layer 590 may be formed to include substantially the same material by a single process, and may be formed in a self-aligned manner. In addition, the contact plug 580 and the pad layer 590 may not be formed by separate processes, which may reduce the etching process for formation of fine patterns. The second conductive layer may include a metal and/or polysilicon doped with impurities.

A plurality of contact plugs 580 may be formed both in the first and second directions, each of which may be formed to contact the impurity region 303. In example embodiments, a top surface of the pad layers 590 may be substantially coplanar with those of the third patterns, the fourth capping layer patterns 540, the etch stop layer patterns 529.

Figure 22:
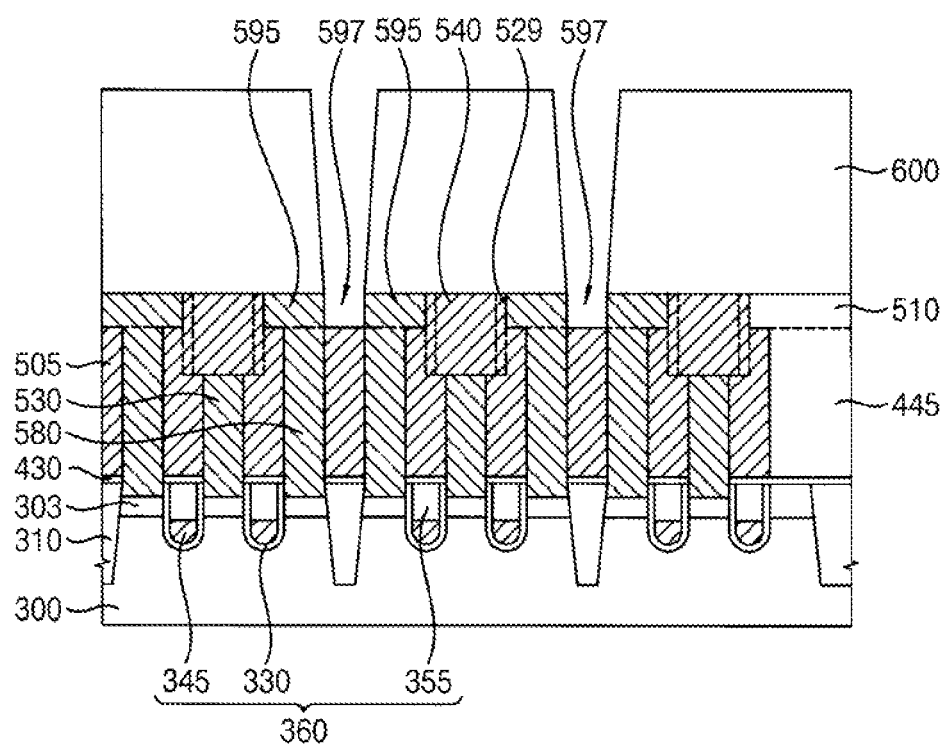

Referring to FIG. 22, a fourth mask 600 may be formed on the pad layers 590, the fourth capping layer patterns 540 and the etch stop layer patterns 529, and the pad layers 590 may be etched using the fourth mask 600 as an etching mask. The pads 595 separated by a tenth opening 597 may be formed.

In example embodiments, the fourth mask 600 may expose portions of the pad layer 590 on the first patterns 505. Each pad layer 590 may be divided into two pads 595 by the etching process, and the tenth openings 597 may expose portions of a top surface of the first patterns 505. A width of each pad 595 in the second direction may be larger than that of each contact plug 580.

Figure 23:
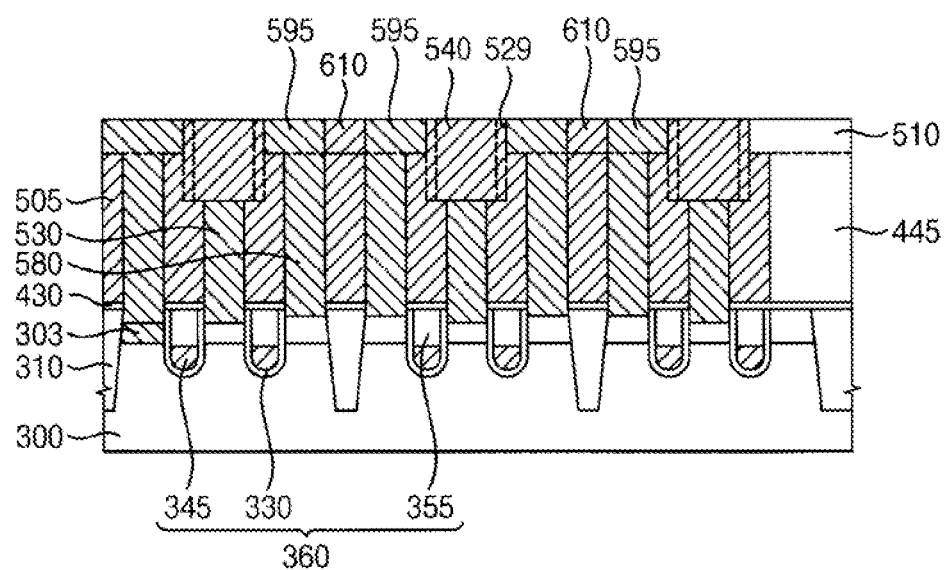

Referring to FIG. 23, a division layer pattern 610 may be formed to fill each tenth opening 597.

The division layer pattern 610 may be formed by removing the fourth mask 600, forming an second insulating layer on the third patterns, the pads 595, the fourth capping layer patterns 540 and the etch stop layer patterns 529 to fill the tenth opening 597, and planarizing an upper portion of the second insulating layer until a top surface of the pacts 595 may be exposed. The second insulating layer may be formed to include a nitride, e.g., silicon nitride.

Figure 24:
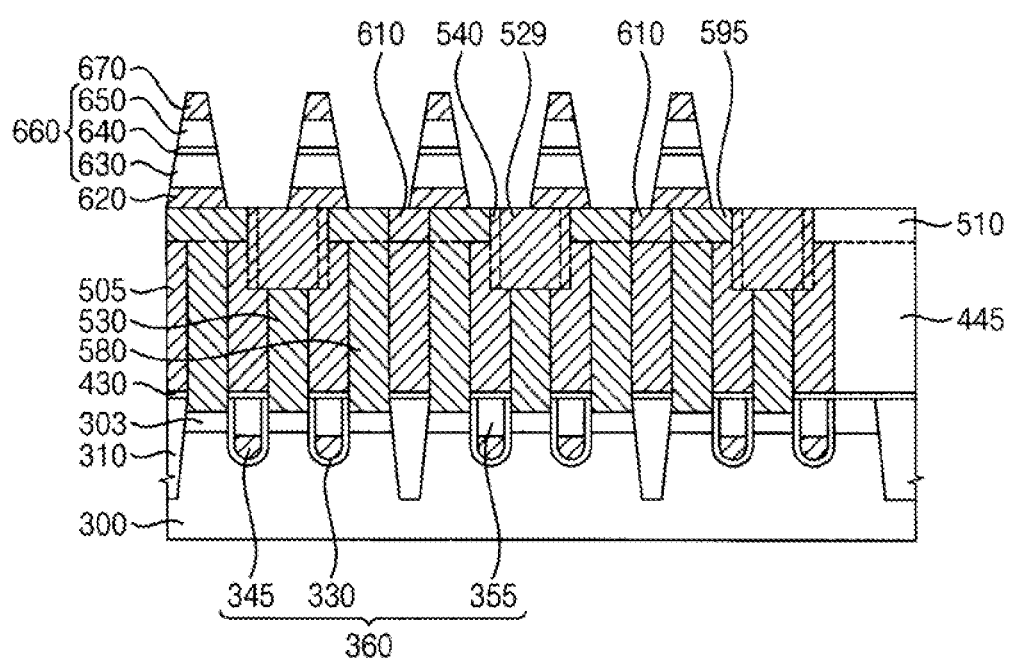

Referring to FIG. 24, a lower electrode 620, a magnetic tunnel junction (MTJ) structure 660 and an upper electrode 670 sequentially stacked on each pad 595 may be formed to contact the top surface thereof. In an example embodiment, the MTJ structure 660 may be formed to include a fixed layer structure pattern 630, a tunnel barrier layer pattern 640 and a free layer pattern 650 sequentially stacked. The MTJ structure 660 may be electrically connected to each pad 595 through the lower electrode 620, and may be electrically connected to the impurity region 303 of the substrate 300.

The lower electrode 620, the MTJ structure 660 and the upper electrode 670 may be formed by the following steps. A lower electrode layer, a fixed layer structure, a tunnel barrier layer, a free layer and an upper electrode layer may be sequentially formed on the pads 595, the division layer patterns 610, the fourth capping layer patterns 540 and the etch stop layer patterns 529. The upper electrode layer may be etched to form die upper electrode 670, and the free layer, the tunnel barrier layer, the fixed layer structure and the lower electrode layer may be sequentially patterned using the upper electrode 670 as an etching mask. A plurality of the lower electrodes 620 and the MTJ structures 660 may be formed both in the first and second directions, and one MTJ structure 660 may be formed to overlap one pad 595.

The lower and upper electrode layers may be formed to include a conductive material, e.g., a metal, such as tungsten (W), titanium (Ti), tantalum (Ta), or a combination thereof, and/or a metal nitride, such as tungsten nitride (WN), titanium nitride (TiN), tantalum nitride (TaN), or a combination thereof. In one embodiment, the lower and upper electrode layers may be formed to include a substantially the same material.

The fixed layer structure may be formed to include a first pinning layer, an anti-ferromagnetic coupling spacer layer and a second pinning layer sequentially stacked, and the first pinning layer may contact a top surface of the lower electrode layer.

The first and second pinning layers may be formed to include a ferromagnetic material, e.g., palladium (Pd). The first and second pinning layers may have first and second magnetization directions, respectively, which are fixed and substantially opposite to each other. In example embodiments, the first and second magnetization directions may be substantially perpendicular to a top surface of the substrate 300 or substantially parallel to the top surface of the substrate 300.

The anti-ferromagnetic coupling spacer layer may be formed to include, e.g., Ru, Ir, or Rh.

The tunnel barrier layer may be formed to include a metal oxide, a metal nitride or a metal oxynitride, e.g., magnesium oxide (MgO) or aluminum oxide ($AlO_x$).

The free layer may be formed to include a ferromagnetic material, e.g., palladium (Pd). The free layer may have a third magnetization direction which may not be fixed in one direction but may be reversible. In example embodiments, the third magnetization direction may be substantially perpendicular to the top surface of the substrate 300 or substantially parallel to the top surface of the substrate 300.

An exemplary MTJ structure 660 and the process for forming the MTJ structure 630 have been described. However, although not specifically illustrated, various types of MTJ structures may be formed.

The patterning process may be performed by a physical etching process such as a plasma reaction etching process or an ion sputtering process. The plasma reaction etching process may be performed using an etching gas including, e.g., HF and/or NH3, and a reaction gas including, e.g., oxygen.

When performing the patterning process, a conductive polymer (not shown) may be generated as an etch by-product, and may be re-sputtered and attached onto a sidewall of the MTJ structure 660. In this case, the re-sputtered conductive polymer may connect the fixed layer structure pattern 630 and the free layer pattern 650 to form an electrical short. Therefore, processes for detecting and removing the conductive polymer may be performed, in example embodiments, the conductive polymer may include a ferromagnetic material in the fixed layer structure and/or the free layer, e.g., palladium (Pd).

Figure 25:
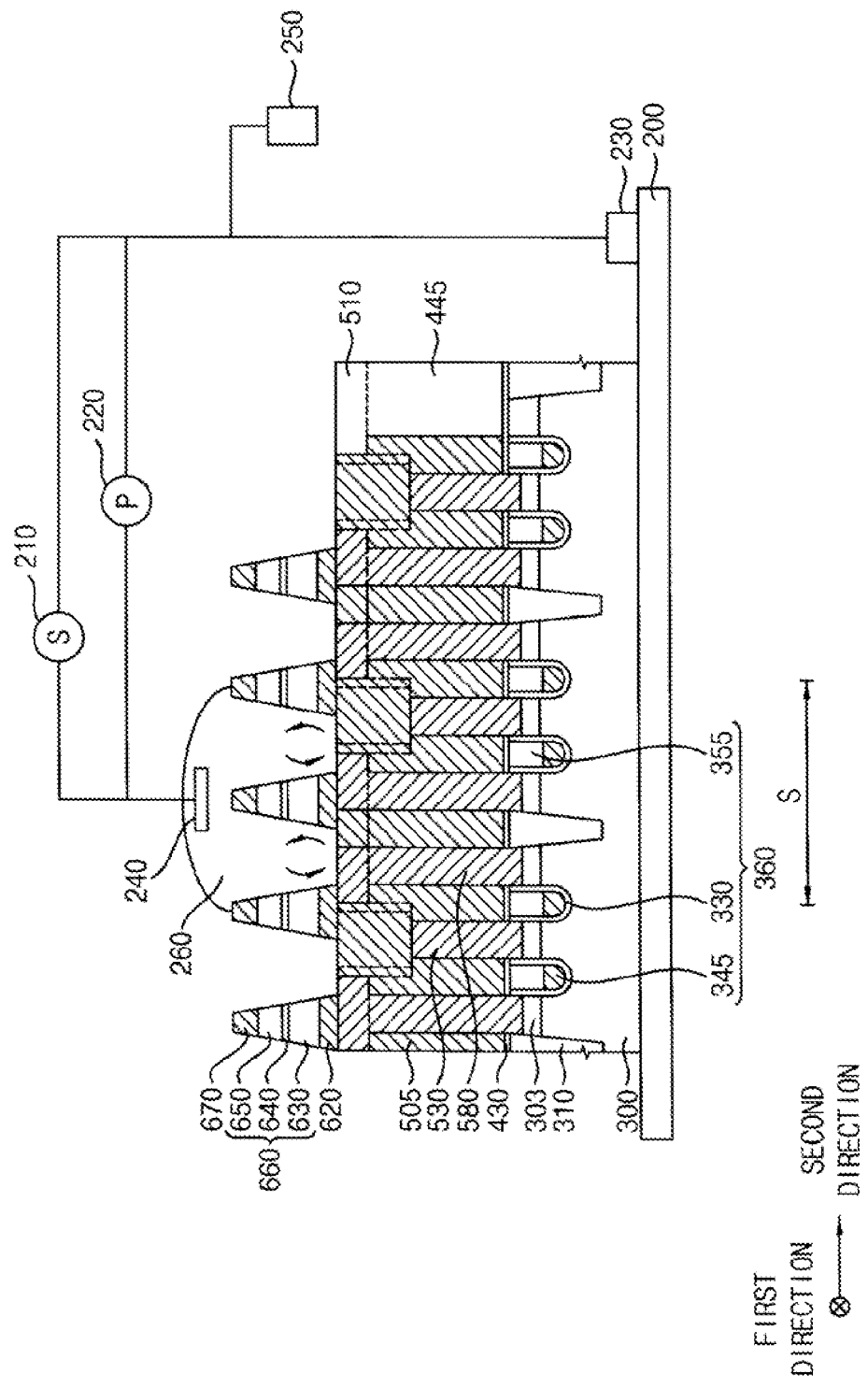

Referring to FIG. 25, processes substantially the same as or similar to those illustrated with reference to FIG. 3 and/or FIG. 4 may be performed. The substrate 300 on which the MTJ structure 660 is formed may be loaded on the stage 200 of a detecting machine (not shown), and the mixture 260 including an alkyl bromide compound may be provided on a sample region S of the substrate 300 to contact the, e.g., entire, sidewall of the MTJ structure 660.

The mixture 260 may be formed by dissolving the alkyl bromide compound in a solvent. The solvent may be an organic solvent, e.g., dimethylformamide (DMF). In example embodiments, the alkyl bromide compound may include 1-bromodecane.

The conductive polymer remaining on the sidewall of the MTJ structure 660 may include palladium (Pd), and the conductive polymer may be reacted with the mixture 260 applied to the sidewall of the MTJ structure 660. A chemical reaction may occur between the alkyl bromide compound in the mixture 260 and palladium in the conductive polymer, and the alkyl bromide compound may be reduced.

Thereafter, a current change, e.g., difference, between the substrate 300 and the mixture 260 may be measured by a cyclic voltammetry.

The first, and second electrodes 230 and 240 contacting the stage 200 and the mixture 260, respectively, may be formed to be electrically connected to each other, and the third electrode 250 may be formed to be electrically connected to the first and second electrodes 230 and 240. The first and second electrodes 230 and 240 may serve as a working electrode and a counter electrode with respect thereto, respectively, to generate an electrode reaction, and the third electrode 250 may serve as a reference electrode for measuring an electrode potential of the electrode reaction. In example embodiments, the first and second electrodes 230 and 240 may include titanium nitride (TiN) and lead (Pb), respectively, and the third electrode 250 may include Ag/AgCl.

Figure 26:
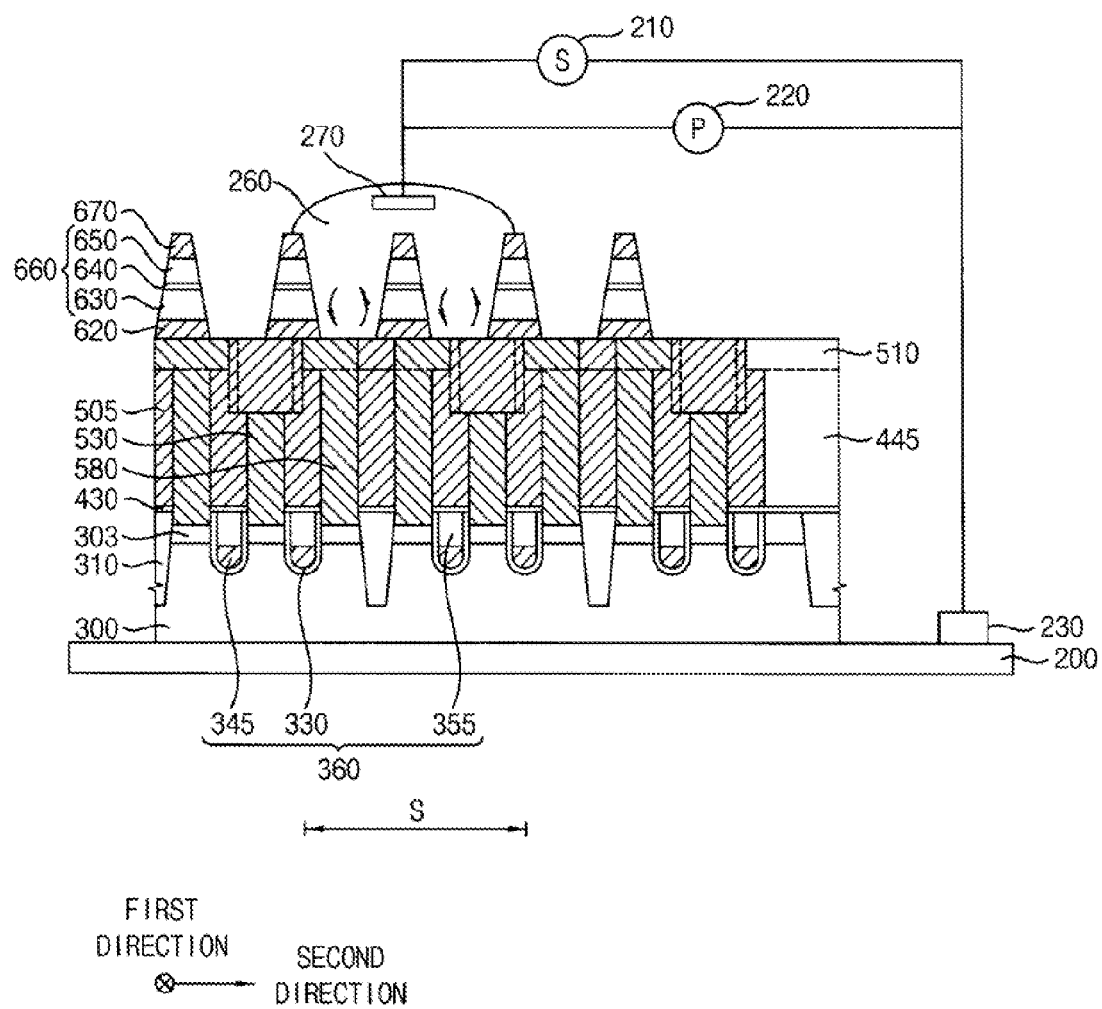

Alternatively, as shown in FIG. 26, the first electrode 230 contacting the stage 200 and the fourth electrode 270 contacting the mixture 260 may be formed to be electrically connected to each other. The first and fourth electrodes 230 and 270 may serve as a working electrode aid a reference electrode, respectively. In example embodiments, the first and fourth electrodes 230 and 270 may include titanium nitride (TiN) and Ag/AgCl, respectively.

A first voltage and a second voltage lower than the first voltage may be alternately and repeatedly applied to the first electrode 230 using the power supply 210, and a current difference may be measured using the potentiometer 220. A conductive polymer including palladium (Pd) may be generated during the etching process and may be deposited on surfaces of the MTJ structure 660, and a rapid current difference may be measured by the potentiometer 220 due to the chemical reaction, i.e., due to reduction of the bromide compound in the mixture 260, according to the first and second voltages applied to the first electrode 230.

An etch by-product including palladium (Pd) being generated during the patterning process may be quickly and easily detected with no damage to the MTJ structure 660.

Thereafter, a reacted mixture 260 may be removed from the sample region S of the substrate 300, and the MTJ structure 660 may be cleaned.

In example embodiments, the cleaning process may be performed using a cleaning composition which may be reacted with palladium (Pd), so that the conductive polymer including palladium may not remain or may not be attached onto the sidewall of the MTJ structure 660 but be removed therefrom.

If a current difference is not measured by the potentiometer 220, the conductive polymer may include a ferromagnetic material without palladium (Pd), or the conductive polymer may not remain on the substrate 300 on winch the MTJ structure 660 is formed. A conductive polymer may be detected by other methods, and also may be removed using a cleaning composition substantially different from the above.

Figure 27:
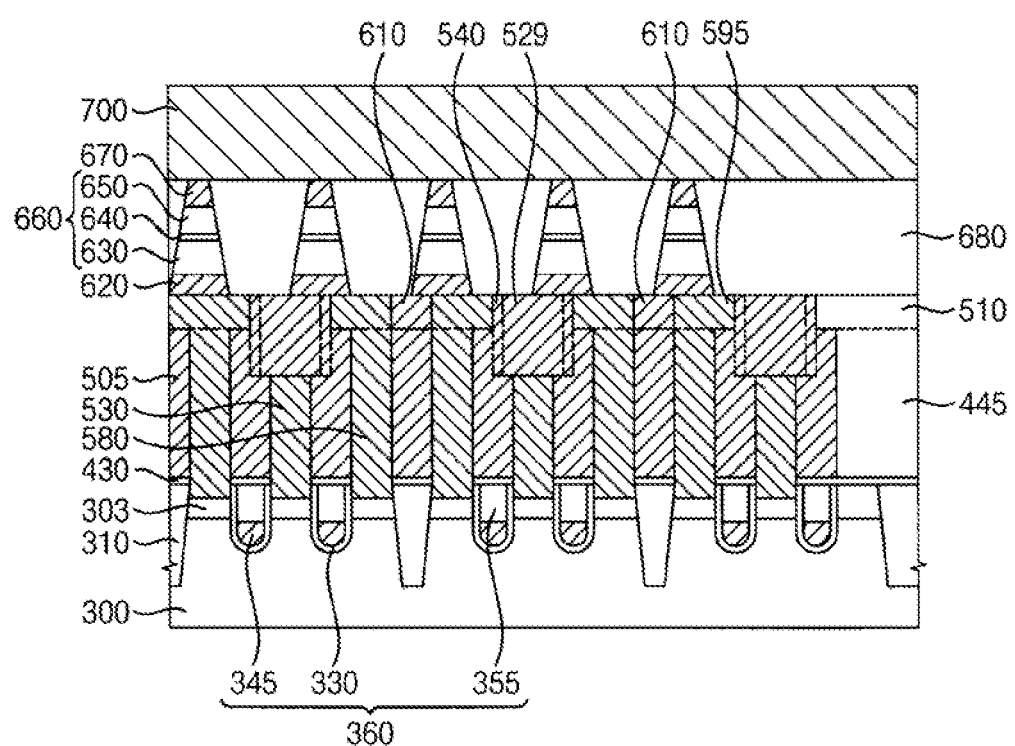

Referring to FIG. 27, a second insulating interlayer 680 covering the lower electrode 620, the MTJ structure 660 and the upper electrode 670 may be formed, an upper portion of the second insulating interlayer 680 may be planarized until a top surface of the upper electrode 670 may be exposed, and a bit line 700 may be formed on the second insulating interlayer 680 to contact the upper electrode 670.

The second insulating interlayer 680 may be formed to include an oxide, e.g., boro phospho silicate glass (BPSG), undoped silicate glass (USG) and spin on glass (SOG).

The bit line 700 may be formed by forming a third conductive layer on the second insulating interlayer 680, and partially etching the third conductive layer. The third conductive layer may be formed to include a metal, a metal nitride and/or a metal silicide. In example embodiments, the bit line 700 may extend in the second direction, and a plurality of bit lines 700 may be formed in the first direction.

As described above, an etch by-product being generated during forming the MTJ structure 660 may be easily detected by a cyclic voltammetry using the mixture 260 including an alkyl bromide compound. A conductive polymer including palladium (Pd) may be generated as the etch by-product in the patterning process for forming the MTJ structure 660, and the conductive polymer may be reacted with the alkyl bromide compound in the mixture 260. A current difference between the MRAM device, which may be formed or manufactured to include the MTJ structure 660 described herein, and the mixture 260 may be measured, and characteristics of the conductive polymer and generation thereof may be quickly and accurately detected.

Moreover, no expensive equipment may be required for detecting the conductive polymer, and the MTJ structure may not be damaged in the detecting process. Therefore, an embodiment may have the advantages of improvement of the productivity and efficiency of the process.

By way of summation and review, a magnetic material of a MTJ structure formed by a physical etching process, such as an ion sputtering, may be re-sputtered as an etch by-product during the etching process, and may be attached to a sidewall of the MTJ structure. The re-sputtered etch by-product on the MTJ structure may cause an electrical short, and a process for detecting generation of the etch by-product may be required. However, accurate detecting in conventional processes may be difficult, and the MTJ structure may be damaged during performing the process.

In contrast, example embodiments provide an effective method of detecting an etch by-product, and a method of manufacturing a magnetoresistive random access memory device having a good electrical characteristic. In detail, according to example embodiments, an etch by-product being generated during forming a magnetic layer pattern, may be easily detected by a cyclic voltammetry using a mixture including an alkyl bromide compound. A conductive polymer including palladium (Pd) may be generated as the etch by-product in an etching process for forming the magnetic layer pattern, and the conductive polymer may be reacted with the alkyl bromide compound. A current difference between a MRAM device and the mixture may be measured, and characteristics of the conductive polymer and generation thereof may be quickly and accurately detected.

Example embodiments have been disclosed herein, and although specific terms are employed, they are used and are to be interpreted in a genetic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a magnetoresistive random access memory (MRAM) device, the method comprising:
    forming a magnetic tunnel junction (MTJ) structure including palladium (Pd) on a substrate;
    depositing a mixture including an alkyl bromide compound on a surface of the MTJ structure;
    measuring a current difference between the substrate and the mixture to detect a conductive polymer including palladium (Pd); and
    cleaning the MTJ structure.

2. The method as claimed in claim 1, wherein the mixture further includes an organic solvent.

3. The method as claimed in claim 1, wherein the alkyl bromide compound includes 1-bromodecane.

4. The method as claimed in claim 1, wherein measuring the current difference between the substrate and the mixture includes:
    forming first and second electrodes to be electrically connected to each other, the first electrode contacting the substrate and second electrodes contacting the mixture; and
    applying a voltage to the first electrode.

5. The method as claimed in claim 1, wherein forming the MTJ structure includes:
    sequentially forming a lower electrode layer, a fixed layer structure, a tunnel barrier layer, a free layer and an upper electrode on the substrate; and
    patterning the free layer, the tunnel barrier layer, the fixed layer structure and the lower electrode layer sequentially using the upper electrode as an etching mask to form the MTJ structure and a lower electrode thereunder, the MTJ structure including a fixed layer structure pattern, a tunnel barrier layer pattern and a free layer pattern sequentially stacked.

6. The method as claimed in claim 5, wherein the fixed layer structure or the free layer includes palladium (Pd).

7. The method as claimed in claim 1, wherein cleaning the MTJ structure includes removing the conductive polymer using a cleaning composition.

8. A method of manufacturing a magnetoresistive random access memory device, the method comprising:
    forming a magnetic layer pattern on a substrate;
    depositing a mixture including an alkyl bromide compound on the magnetic layer pattern; and
    measuring a current difference between the substrate and the mixture,
    wherein the magnetic layer pattern is not damaged by the depositing or measuring steps.

9. The method as claimed in claim 8, wherein:
    the measuring step indicates presence of a conductive polymer; and
    the depositing step initiates a chemical reaction between the alkyl bromide compound and palladium in the conductive polymer.

10. The method as claimed in claim 9, further comprising reducing the alkyl bromide compound by the chemical reaction.

11. The method as claimed in claim 8, further comprising removing the mixture.

12. The method as claimed in claim 8, further comprising generating the conductive polymer during the forming step.

* * * * *